(12) United States Patent
Yun et al.

(10) Patent No.: US 10,998,033 B2
(45) Date of Patent: May 4, 2021

(54) SEMICONDUCTOR MEMORY DEVICE AND OPERATING METHOD THEREOF

(71) Applicant: SK hynix Inc., Gyeonggi-do (KR)

(72) Inventors: Tae-Sik Yun, Seoul (KR); Dae-Suk Kim, Seoul (KR); Seok-Cheol Yoon, Seoul (KR); No-Guen Joo, Gyeonggi-do (KR)

(73) Assignee: SK hynix Inc., Gyeonggi-do (KR)

( * ) Notice: Subject to any disclaimer, the term of this patent is extended or adjusted under 35 U.S.C. 154(b) by 0 days.

(21) Appl. No.: 16/682,696

(22) Filed: Nov. 13, 2019

(65) Prior Publication Data

US 2020/0185026 A1 Jun. 11, 2020

(30) Foreign Application Priority Data

Dec. 6, 2018 (KR) ........................ 10-2018-0155909

(51) Int. Cl.
| | |
|---|---|
| *G11C 11/406* | (2006.01) |
| *G11C 11/4091* | (2006.01) |
| *G11C 11/408* | (2006.01) |
| *G11C 11/4076* | (2006.01) |

(52) U.S. Cl.
CPC .... *G11C 11/40618* (2013.01); *G11C 11/4076* (2013.01); *G11C 11/4085* (2013.01); *G11C 11/4087* (2013.01); *G11C 11/4091* (2013.01)

(58) Field of Classification Search
CPC .............. G11C 11/406; G11C 11/4091; G11C 11/40618; G11C 11/4087; G11C 11/4076; G11C 11/4085; G11C 11/40603; G11C 16/08

USPC ................................................... 365/149, 222
See application file for complete search history.

(56) References Cited

U.S. PATENT DOCUMENTS

| | | | | | |
|---|---|---|---|---|---|
| 5,384,745 | A | * | 1/1995 | Konishi | .................. G11C 7/10 365/193 |
| 5,835,436 | A | * | 11/1998 | Ooishi | ..................... G11C 7/10 365/230.03 |
| 5,936,909 | A | * | 8/1999 | Sonoda | ................ G11C 7/1018 365/230.03 |
| 6,480,425 | B2 | * | 11/2002 | Yanagisawa | ........... G11C 5/025 365/189.05 |
| 6,535,451 | B2 | * | 3/2003 | Sekiguchi | ................ G11C 7/18 365/205 |
| 7,663,954 | B2 | * | 2/2010 | Teramoto | ............... G11C 7/065 365/205 |
| 2003/0112689 | A1 | * | 6/2003 | Natsui | ................... G11C 11/406 365/222 |
| 2003/0235101 | A1 | * | 12/2003 | Tanaka | ............... H01L 27/0207 365/203 |

(Continued)

FOREIGN PATENT DOCUMENTS

| | | |
|---|---|---|
| KR | 10-2016-0074920 | 6/2016 |
| KR | 10-2017-0112038 | 10/2017 |

*Primary Examiner* — Michael T Tran

(74) *Attorney, Agent, or Firm* — IP & T Group LLP

(57) ABSTRACT

A semiconductor memory device includes: a plurality of banks each including a plurality of cell mats and a plurality of sense amplifiers shared by adjacent cell mats; and a bank control circuit suitable for activating a normal word line of a particular cell mat of a bank selected according to a refresh command including bank information, and activating a target word line of a cell mat that does not share a sense amplifier with the particular cell mat according to a target refresh command after a preset delay time.

22 Claims, 10 Drawing Sheets

(56) References Cited

U.S. PATENT DOCUMENTS

| | | | |
|---|---|---|---|
| 2008/0037356 A1* | 2/2008 | Kajigaya | G11C 8/10 365/230.03 |
| 2008/0304340 A1* | 12/2008 | Kyung | G11C 11/4076 365/194 |
| 2009/0147614 A1* | 6/2009 | Lee | G11C 11/4094 365/230.01 |
| 2011/0026348 A1* | 2/2011 | Narui | G11C 11/4097 365/210.1 |
| 2012/0026813 A1* | 2/2012 | Sato | G11C 11/406 365/194 |
| 2013/0135947 A1* | 5/2013 | Noguchi | G11C 7/00 365/189.11 |
| 2013/0308403 A1* | 11/2013 | Nakai | G11C 7/12 365/203 |
| 2014/0003113 A1* | 1/2014 | Seno | G11C 5/02 365/51 |
| 2014/0063977 A1* | 3/2014 | Park | G11C 7/06 365/189.05 |
| 2014/0092680 A1* | 4/2014 | Lee | H01L 27/10897 365/182 |
| 2014/0146590 A1* | 5/2014 | Fukushi | G11C 5/025 365/51 |
| 2015/0120997 A1* | 4/2015 | Mitsubori | G11C 7/08 711/105 |
| 2015/0131387 A1* | 5/2015 | Jeon | G11C 16/08 365/185.29 |
| 2015/0255146 A1* | 9/2015 | Mochida | G11C 8/08 365/72 |
| 2015/0262650 A1* | 9/2015 | Okahiro | G11C 11/4074 365/189.011 |
| 2017/0084353 A1* | 3/2017 | Park | G11C 11/4087 |
| 2017/0110161 A1* | 4/2017 | Seo | H01L 23/50 |
| 2017/0186477 A1* | 6/2017 | Park | G11C 11/4097 |
| 2019/0362767 A1* | 11/2019 | Na | G11C 11/4097 |
| 2019/0392885 A1* | 12/2019 | Bateman | G11C 5/025 |
| 2020/0027497 A1* | 1/2020 | Shin | G06F 3/0673 |
| 2020/0043566 A1* | 2/2020 | Seo | G11C 29/12005 |
| 2020/0185026 A1* | 6/2020 | Yun | G11C 11/4085 |
| 2020/0243154 A1* | 7/2020 | Sity | G11C 11/40618 |
| 2020/0273517 A1* | 8/2020 | Yamamoto | G11C 11/4085 |

\* cited by examiner

SEMICONDUCTOR MEMORY DEVICE AND OPERATING METHOD THEREOF

CROSS-REFERENCE TO RELATED APPLICATIONS

The present application claims priority of Korean Patent Application No. 10-2018-0155909, filed on Dec. 6, 2018, which is incorporated herein by reference in its entirety.

BACKGROUND

1. Field

Various embodiments of the present invention relate to a semiconductor design technology, and more particularly, to a semiconductor memory device performing a refresh operation, and a method for operating a semiconductor memory device.

2. Description of the Related Art

A memory cell of a semiconductor memory device is formed of a transistor serving as a switch and a capacitor for storing a charge (i.e., a data). In other words, the logic level of a data is divided into 'high' (Logic 1) and 'low' (Logic 0) according to whether or not there is a charge in the capacitor of a memory cell, that is, whether the terminal voltage of the capacitor is high or low.

Since data are stored in the form of charges accumulated in the capacitor, there is no power consumption in principle. However, due to current leakage caused by a PN coupling of a transistor and the like, the initial amount of charges stored in the capacitor may not be maintained. As a result, data may be lost. To prevent losing data, the data in the memory cell has to be read before the data is lost, and the normal amount of charge has to be charged again according to the read information. This operation is required to be performed repeatedly at a predetermined period to retain the data. The process of recharging a memory cell is referred to as a refresh operation (hereinafter, referred to as a 'normal refresh operation').

Recently, in addition to the normal refresh operation, another refresh operation (hereinafter referred to as a 'target refresh operation') may be performed on the memory cells of a particular word line that are highly likely to lose data due to a row hammering phenomenon. The row hammering phenomenon may refer to a phenomenon in which data of memory cells coupled to a particular word line or adjacent word lines to the particular word line are damaged due to a high activation frequency of the particular word line. In order to prevent the row hammering phenomenon, a target refresh operation may be performed on a word line which is activated a predetermined number of times or more, or adjacent word lines thereto.

SUMMARY

Embodiments of the present invention are directed to a semiconductor memory device capable of supporting both of a single-bank refresh operation and a target refresh operation, and a method for operating the semiconductor memory device.

In accordance with an embodiment of the present invention, a semiconductor memory device includes: a plurality of banks each including a plurality of cell mats and a plurality of sense amplifiers shared by adjacent cell mats; and a bank control circuit suitable for activating a normal word line of a particular cell mat of a bank selected according to a refresh command including bank information, and activating a target word line of a cell mat that does not share a sense amplifier with the particular cell mat according to a target refresh command after a preset delay time.

In accordance with an embodiment of the present invention, a semiconductor memory device includes: a plurality of banks each including a plurality of cell mats and a plurality of sense amplifiers shared by adjacent cell mats; an activation control circuit suitable for generating a first activation signal according to a refresh command including bank information, generating a second activation signal according to a target refresh command, and outputting the first activation signal and the second activation signal to a selected bank among the plurality of banks at an interval of a preset delay time; and a plurality of mat control circuits respectively corresponding to the cell mats of each bank, suitable for activating a normal word line based on the first activation signal, and activating the target word line based on the second activation signal while masking the second activation signal when the normal word line and the target word line are included in the same cell mat or in the adjacent cell mats.

In accordance with an embodiment of the present invention, a method for operating a semiconductor memory device includes: providing a plurality of banks each including a plurality of cell mats and a plurality of sense amplifiers shared by adjacent cell mats; outputting a first activation signal and a counting address to a bank selected according to a refresh command including bank information; activating a normal word line corresponding to the counting address based on the first activation signal; outputting a second activation signal and a pre-stored target address to the selected bank at an interval of a preset delay time; and activating a target word line corresponding to the target address based on the second activation signal while deactivating the target word line by masking the second activation signal when the normal word line and the target word line are included in the same cell mat or in the adjacent cell mats.

In accordance with an embodiment of the present invention, a memory device includes: a storage circuit including groups of memory cells electrically coupled to word lines and sense amplifiers each electrically coupled to neighboring ones among the groups; and a control circuit configured to activate first and second word lines among the word lines at a preset interval of time respectively in response to first and second refresh commands, wherein the first and second word lines are electrically coupled to different ones among the groups electrically coupled to different ones among the sense amplifiers.

In accordance with an embodiment of the present invention, an operating method of a memory device including groups of memory cells electrically coupled to word lines and sense amplifiers each electrically coupled to neighboring ones among the groups, includes: activating first and second word lines among the word lines at a preset distance of time respectively in response to first and second refresh commands, wherein the first and second word lines are electrically coupled to different ones among the groups electrically coupled to different ones among the sense amplifiers.

In accordance with an embodiment of the present invention, a memory device includes: a bank including cell mats electrically coupled to word lines and sense amplifiers each electrically coupled to neighboring ones among the cell mats; a first control circuit configured to provide a first pair of a first active signal and a first address and a second pair of a second active signal and a second address at a preset interval of time respectively in response to first and second refresh commands; and a second control circuit configured to activate a word line corresponding to the first pair among the word lines when the first and second addresses correspond to word lines, among the word lines, electrically coupled to a single one or neighboring ones among the cell mats and activate word lines respectively corresponding to the first and second pairs among the word lines otherwise.

In accordance with an embodiment of the present invention, an operating method of a memory device including cell mats electrically coupled to word lines and sense amplifiers each electrically coupled to neighboring ones among the cell mats, includes: providing a first pair of a first active signal and a first address and a second pair of a second active signal and a second address at a preset distance of time respectively in response to first and second refresh commands; and activating a word line corresponding to the first pair among the word lines when the first and second addresses correspond to word lines, among the word lines, electrically coupled to a single one or neighboring ones among the cell mats and activating word lines respectively corresponding to the first and second pairs among the word lines otherwise.

DETAILED DESCRIPTION

Figure 1A:
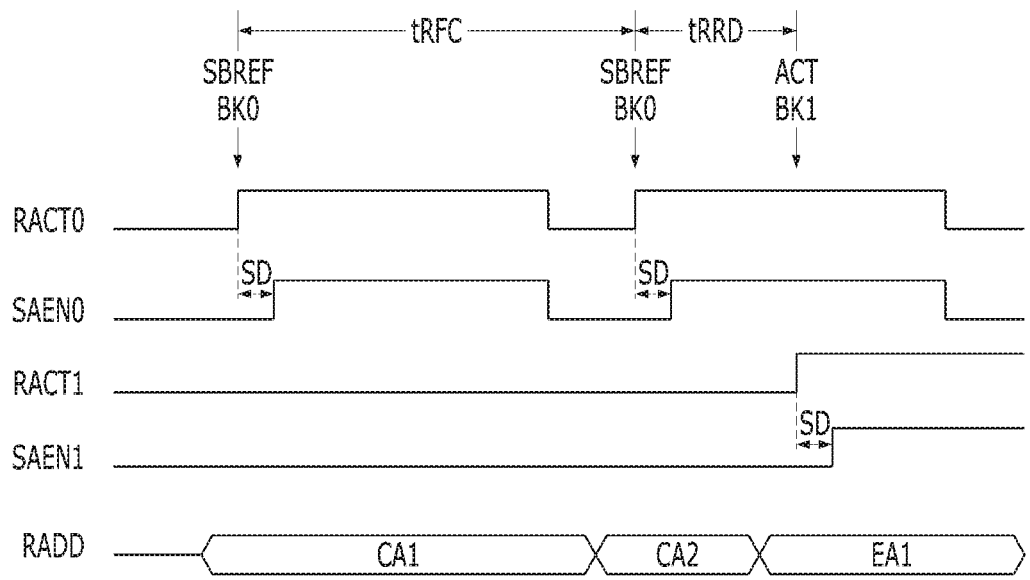
FIGS. 1A and 1B are operation waveform diagrams describing a refresh operation of a semiconductor memory device.

Various embodiments of the present invention will be described below in more detail with reference to the accompanying drawings. The present invention may, however, be embodied in different forms and should not be construed as limited to the embodiments set forth herein. Rather, these embodiments are provided so that this disclosure will be thorough and complete, and will fully convey the scope of the present invention to those skilled in the art. Throughout the disclosure, like reference numerals refer to like parts throughout the various figures and embodiments of the present invention.

It is noted that reference to "an embodiment," "another embodiment" or the like does not necessarily mean only one embodiment, and different references to any such phrase are not necessarily to the same embodiment(s).

It will be understood that, although the terms "first", "second", "third", and so on may be used herein to describe various elements, these elements are not limited by these terms. These terms are used to distinguish one element from another element. Thus, a first element described below could also be termed as a second or third element without departing from the spirit and scope of the present invention.

It will be further understood that the terms "comprises," "comprising," "includes," and "including" when used in this specification, specify the presence of the stated elements and do not preclude the presence or addition of one or more other elements. As used herein, the term "and/or" includes any and all combinations of one or more of the associated listed items.

As used herein, singular forms may include the plural forms as well and vice versa, unless the context clearly indicates otherwise. The articles 'a' and 'an' as used in this application and the appended claims should generally be construed to mean 'one or more' unless specified otherwise or clear from context to be directed to a singular form.

A normal refresh operation may be divided into an all-bank refresh operation for refreshing all the banks in a semiconductor memory device and a single bank refresh operation for independently refreshing each bank. In the all-bank refresh operation, when a refresh command is inputted, row addresses may be sequentially outputted to perform refresh operations for all the banks. In the single-bank refresh operation, whenever a refresh command including information on a particular bank, which may be simply referred to as particular bank information, is applied from the outside of the semiconductor memory device, a refresh operation may be performed only for the particular bank corresponding the refresh command. This may also be referred to as a 'per-bank refresh operation'.

In a semiconductor memory device that supports the single bank refresh operation, a plurality of banks provided in the inside of the semiconductor memory device may receive different commands at a time interval of a Row Address Strobe (RAS)-to-RAS delay time tRRD, respectively. Herein, the RAS-to-RAS delay time tRRD may be defined as an interval between the input of the first active command and the input of the next active command when the active commands are inputted consecutively.

Herein, since the banks of the semiconductor memory device may be independently refreshed through the single bank refresh operation, a refresh cycle time tRFC of the refresh operations performed on the banks may be a minimally required time, for example, an active-precharge time tRP. That is, the time reserved for each refresh operation may become very short due to the single bank refresh operation. For this reason, when a target refresh operation is performed in a semiconductor memory device that supports the single bank refresh operation, a timing margin is not sufficient which restricts a target refresh operation.

Figure 1B:
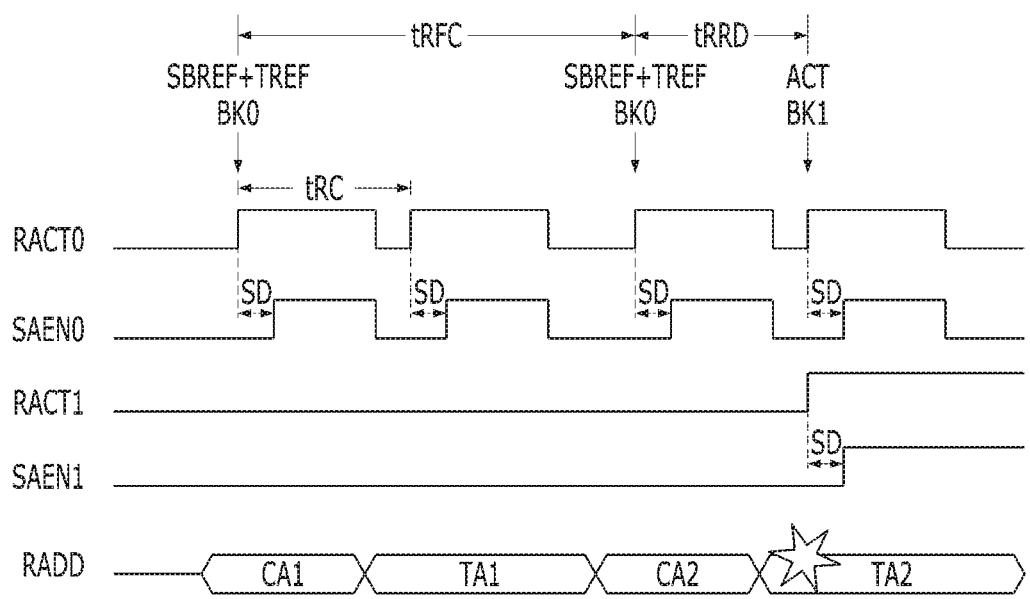

FIGS. 1A and 1B are operation waveform diagrams describing a single bank refresh operation. FIG. 1A is a timing diagram illustrating a case where a target refresh operation is not performed during a single bank refresh operation, and FIG. 1B shows a case where a target refresh operation is performed during a single bank refresh operation. In FIGS. 1A and 1B, a reference symbol 'RACTx' may be a row active signal for each bank for activating a word line corresponding to a row address, and a reference symbol 'SAENx' may be a sense amplifier enable signal for each bank for activating a bit line sense amplifier (BLSA), and a reference symbol 'RADD' may represent a row address.

Referring to FIG. 1A, a refresh command SBREF for a first bank BK0 may be inputted. Herein, the refresh command SBREF for the first bank BK0 may be defined as a single bank refresh command. A counting address CA1 generated by counting the refresh command SBREF may be outputted as a row address RADD, and a row active signal RACT0 for activating a word line of the first bank BK0 corresponding to the row address RADD may be activated. A sense amplifier enable signal SAEN0 may be activated after a sensing delay time SD passes from the activation of the row active signal RACT0, and the memory cells coupled to the word line of the first bank BK0 corresponding to the row address RADD may be refreshed.

Subsequently, a refresh command SBREF for the first bank BK0 may be inputted after the refresh cycle time tRFC. A counting address CA2 of a new value which is generated by counting up or counting down the previous counting address CA1 according to the refresh command SBREF may be outputted as the row address RADD, and the row active signal RACT0 may be activated. In the same manner, the sense amplifier enable signal SAEN0 may be activated after the sensing delay time SD, and the memory cells coupled to the word line of the first bank BK0 corresponding to the row address RADD may be refreshed.

Meanwhile, when the active command ACT for the second bank BK1 is inputted after the RAS-to-RAS delay time tRRD passes from the input of the second refresh command SBREF, an input address EA1 may be outputted. Also, a row active signal RACT1 for the second bank BK1 may be activated, and a sense amplifier enable signal SAEN1 may be activated after the sensing delay time SD passes from the activation of the row active signal RACT1. Herein, although the first bank BK0 and the second bank BK1 share a row address RADD line, a normal operation may be performed because timing margin is guaranteed.

Referring to FIG. 1B, a refresh command SBREF and a target refresh command TREF for the first bank BK0 may be inputted. The counting address CA1 may be outputted as the row address RADD according to the refresh command SBREF, and a target address TA1 may be outputted as the row address RADD according to a target refresh command TREF. The row active signal RACT0 may be activated twice at an interval of a RAS cycle time tRC, and the sense amplifier enable signal SAEN0 may be activated twice after the sensing delay time SD passes for each of the two activations of the row active signal RACT0. Accordingly, a refresh operation (which includes a normal refresh and a target refresh operation) may be performed twice sequentially within the refresh cycle time tRFC.

Subsequently, the refresh command SBREF and the target refresh command TREF for the first bank BK0 may be inputted after the refresh cycle time tRFC. In the same manner, the counting address CA2 and the target address TA2 may be sequentially outputted as the row address RADD, and the row active signal RACT0 may be activated twice within the refresh cycle time tRFC.

Herein, when the active command ACT for the second bank BK1 is inputted after the RAS-to-RAS delay passes from the input of the second refresh command SBREF, the row address RADD may have to be outputted based on an external address EA1. However, since an address counter or an address latch already outputs the target address TA2 as the row address RADD for a target refresh operation of the first bank BK0 to occupy a shared row address RADD line, a normal operation may not be performed.

In order to prevent the above-described problems from occurring, at present, semiconductor memory devices are designed not to support a target refresh operation when a single refresh operation is performed, or not to perform an operation corresponding to an active command for another bank while a single bank refresh operation and a target refresh operation are performed and the active command for another bank is inputted. Therefore, the refresh efficiency of the semiconductor memory devices may be deteriorated.

Hereinafter, a semiconductor memory device capable of performing both of the single bank refresh operation and the target refresh operation will be described in accordance with an embodiment of the present invention. Hereinafter, description on an all-bank refresh operation and read and write operations will be omitted, and in order to fully explain the feature of the present invention the description will be focused on the single bank refresh operation. Also, the description will be mainly provided in the aspect of row control which is related to a refresh operation. Hereinafter, a normal refresh operation may include a single bank refresh operation.

Figure 2:
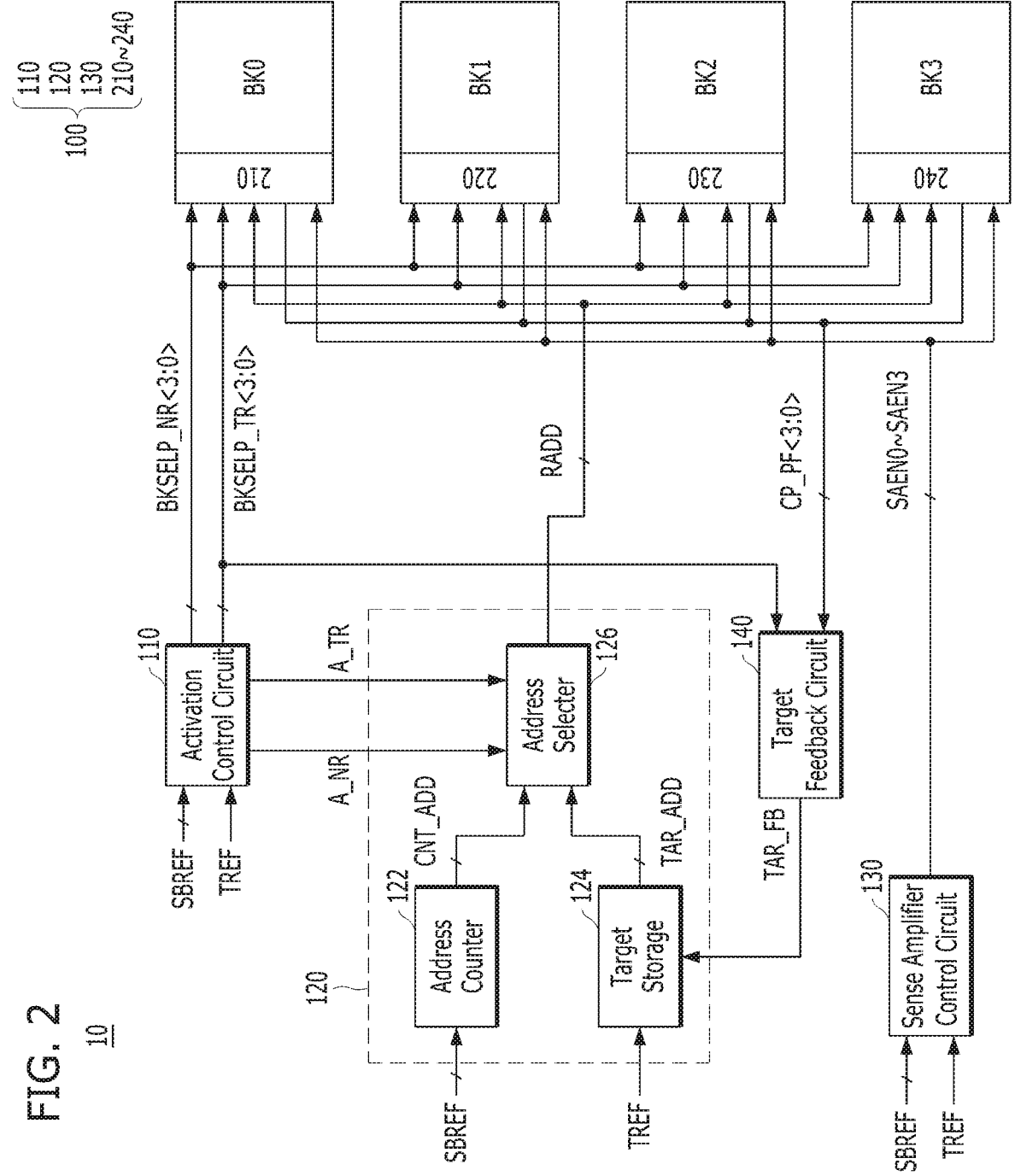
FIG. 2 is a block diagram illustrating a semiconductor memory device in accordance with an embodiment of the present invention.

FIG. 2 is a block diagram illustrating a semiconductor memory device 10 in accordance with an embodiment of the present invention.

Referring to FIG. 2, the semiconductor memory device 10 may include a plurality of banks BK0 to BK3 and a bank control circuit 100. The banks BK0 to BK3 may include a plurality of cell mats and a plurality of sense amplifiers SA which are shared by adjacent cell mats. In the embodiment of the present invention, a case where the semiconductor memory device 10 includes four banks and each bank includes four cell mats and three sense amplifiers will be described as an example. However, the number of banks, cell mats, and sense amplifiers are merely examples, and the present invention is not limited thereto.

Figure 3:
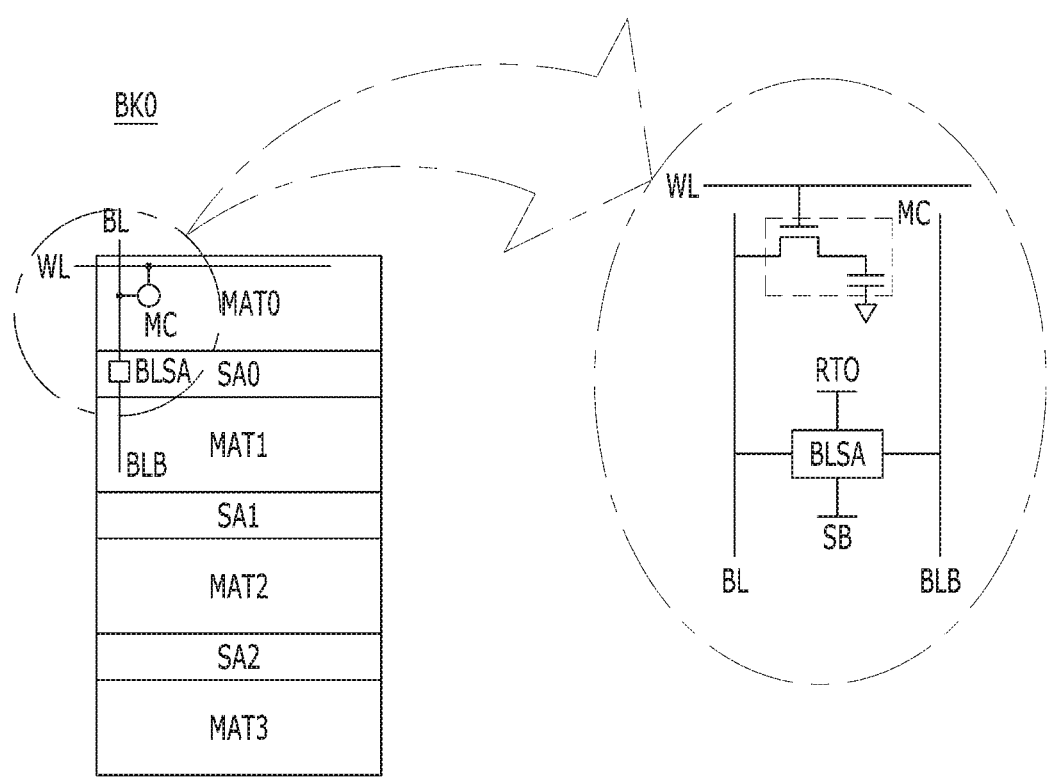
FIG. 3 is a block diagram illustrating an internal structure of a first bank shown in FIG. 2.

FIG. 3 is a block diagram illustrating an internal structure of a first bank BK0 shown in FIG. 2, according to an embodiment. The second to fourth banks BK1 to BK3 may also have substantially the same structure as the first bank BK0. Thus, only the first bank BK0 is illustrated in FIG. 2 for ease of description.

Referring to FIG. 3, the first bank BK0 may include first to fourth cell mats MAT0 to MAT3 and first to third sense amplifiers SA0 to SA2 that are shared by the adjacent cell mats.

A memory cell MC may be formed of a capacitor and a transistor, which are coupled between a word line WL and a bit line BL. A cell mat may be defined as a unit in which a plurality of memory cells MC are arranged in the form of a mat.

The bit line BL may be coupled to a bit line sense amplifier BLSA. The first to third sense amplifiers SA0 to SA2 may include the bit line sense amplifiers BLSA coupled to a bit line BL, respectively. The bit line sense amplifiers BLSA may be activated by receiving supply voltages RTO and SB, and perform a function of amplifying the potential of the bit line BL. The potential of the memory cell MC transferred to the bit line BL may be amplified during a read operation, and an input potential transferred to the bit line BL may be amplified during a write operation.

The first to third sense amplifiers SA0 to SA2 may be disposed between the adjacent cell mats (for example, an upper mat and a lower mat) to amplify the difference between the bit line BL of the upper mat and the bit line BLB of the lower mat. For example, the first sense amplifier SA0 may be coupled to the bit line BL of the first cell mat MAT0 and the bit line BLB of the second cell mat MAT1 to amplify the voltage difference therebetween. According to the embodiment of the present invention, the first to third sense amplifiers SA0 to SA2 may amplify the voltage difference between the bit line BL and the bit line BLB extending from the same cell mat. For example, the first sense amplifier SA0 may be coupled to the bit line BL and the bit line BLB of the first cell mat MAT0 to amplify the voltage difference therebetween, and coupled to the bit line BL and the bit line BLB of the second cell mat MAT1 to amplify the voltage difference therebetween.

Referring back to FIG. 2, the bank control circuit 100 may activate a normal word line of a particular cell mat of a bank selected according to a refresh command SBREF including bank information, and may activate a target word line of a cell mat that does not share the particular cell mat and sense amplifier in response to a target refresh command TREF after a predetermined delay time passes. Herein, the refresh command SBREF including the bank information may be a single bank refresh command, and the refresh command SBREF may be formed of bits whose number corresponds to the number of banks in accordance with the embodiment of the present invention. According to an embodiment of the present invention, the predetermined delay time may be a RAS-to-RAS delay time tRRD. Also, the bank control circuit 100 may activate first to fourth sense amplifier enable signals SAEN0 to SAEN3 for enabling the sense amplifiers included in the first to fourth banks BK0 to BK3, after the normal word line and the target word line are activated.

According to an embodiment, the bank control circuit 100 may include an activation control circuit 110, an address generation circuit 120, a sense amplifier control circuit 130, a target feedback circuit 140, and first to fourth row circuits 210 to 240.

The activation control circuit 110 may output a normal word line activation signal (hereinafter, referred to as a 'first activation signal BKSELP_NR<3:0>') for performing a normal refresh operation on the selected bank and a target word line activation signal (hereinafter, referred to as a 'second activation signal BKSELP_TR<3:0>') for performing a target refresh operation at an interval of a predetermined delay time according to the refresh command SBREF and the target refresh command TREF. Each of the first activation signal BKSELP_NR<3:0> and the second activation signal BKSELP_TR<3:0> may have bits, the number of which corresponds to the number of banks. The activation control circuit 110 may activate the first activation signal BKSELP_NR<3:0> of the selected bank when the refresh command SBREF is inputted, and may output the first activation signal BKSELP_NR<3:0> and the second activation signal BKSELP_TR<3:0> of the selected bank at an interval of the RAS-to-RAS delay time tRRD when both of the refresh command SBREF and the target refresh command TREF are inputted.

Meanwhile, the activation control circuit 110 may generate a first selection signal A_NR which is activated before the first activation signal BKSELP_NR<3:0> is activated, and a second selection signal A_TR which is activated before the second activation signal BKSELP_TR<3:0>.

For example, the first selection signal A_NR may be activated before a predetermined moment when any one of the bits of the first activation signal BKSELP_NR<3:0> is activated. The second selection signal A_TR may be activated before a predetermined moment when any one of the bits of the second activation signal BKSELP_TR<3:0> is activated.

The address generation circuit 120 may output the row address RADD by selecting a counting address CNT_ADD according to the refresh command SBREF, and selecting a pre-stored target address TAR_ADD according to the target refresh command TREF. Herein, since the first to fourth banks BK0 to BK3 share a row address RADD line, the row address RADD may be simultaneously provided to the first to fourth banks BK0 to BK3. The address generation circuit 120 may output the counting address CNT_ADD and the target address TAR_ADD as the row address RADD at the interval of the RAS-to-RAS delay time tRRD.

According to an embodiment, the address generation circuit 120 may include an address counter 122, a target storage 124, and an address selector 126.

The address counter 122 may generate the counting address CNT_ADD that sequentially increases by counting the refresh command SBREF. The address counter 122 may increase the counting address CNT_ADD one by one after all of the refresh commands SBREF for the first to fourth banks BK0 to BK3 are inputted once.

The target storage 124 may select and output the target address TAR_ADD from pre-stored addresses therein according to the target refresh command TREF. For example, the target storage 124 may pre-store addresses from 1 to 100 and sequentially output one of them as the target address TAR_ADD whenever a target refresh command TREF is inputted. Also, the target storage 124 may control the output of the target address TAR_ADD based on the feedback signal TAR_FB. In an embodiment of the present invention, the target address TAR_ADD may be stored in the target storage 124. However, according to another embodiment of the present invention, the target address TAR_ADD may be inputted from the outside along with the target refresh command TREF. In this case, the target storage 124 may store the target address TAR_ADD inputted from the outside together with the target refresh command TREF, and control the output of the stored target address TAR_ADD based on the feedback signal TAR_FB.

The address selector 126 may select the counting address CNT_ADD and output it as the row address RADD, and select the target address TAR_ADD in the interval of the RAS-to-RAS delay time tRRD and output it as the row address RADD. The address selector 126 may operate in synchronization with the first selection signal A_NR and the second selection signal A_TR. In other words, the address selector 126 may select the counting address CNT_ADD based on the first selection signal A_NR and output it as the row address RADD, and select the target address TAR_ADD based on the second selection signal A_TR and output it as the row address RADD.

The sense amplifier control circuit 130 may generate the first to fourth sense amplifier enable signals SAEN0 to SAEN3 for enabling the sense amplifiers included in the first to fourth banks BK0 to BK3. When both of the refresh command SBREF and the target refresh command TREF are inputted, the sense amplifier control circuit 130 may activate and output the sense amplifier enable signals SAEN0 to SAEN3 of the selected bank after the RAS-to-RAS delay time tRRD. When the time required for the sense amplifier control circuit 130 to perform an internal operation is defined as a sensing delay time SD, the first to fourth sense amplifier enable signals SAEN0 to SAEN3 may be activated after the sensing delay time SD and the RAS-to-RAS delay time tRRD pass from the input of the refresh command SBREF and the target refresh command TREF when both normal refresh operation and target refresh operation are performed, whereas the first to fourth sense amplifier enable signals SAEN0 to SAEN3 are activated after the sensing delay time SD passes from the input of the refresh command SBREF when a read/write operation or a normal refresh operation is performed.

The first to fourth row circuits 210 to 240 may be disposed adjacent to the word lines of the first to fourth banks BK0 to BK3 to correspond to the first to fourth banks BK0 to BK3, respectively. The first to fourth row circuits 210 to 240 may receive corresponding bits of the first activation signal BKSELP_NR<3:0> and the second activation signal BKSELP_TR<3:0>, respectively. The first to fourth row circuits 210 to 240 may activate the word line corresponding to the row address RADD based on the first activation signal BKSELP_NR<3:0> and the second activation signal BKSELP_TR<3:0>. In other words, the first to fourth row circuits 210 to 240 may activate a normal word line corresponding to the counting address CNT_ADD based on the first activation signal BKSELP_NR<3:0>, and activate a target word line corresponding to the target address TAR_ADD based on the second activation signal BKSELP_TR<3:0> inputted after the RAS-to-RAS delay time tRRD. Herein, when the word lines (i.e., a normal word line and a target word line) corresponding to the counting address CNT_ADD and the target address TAR_ADD are positioned in the same cell mat or in adjacent cell mats, the first to fourth row circuits 210 to 240 may control the target word line not to be activated by masking the second activation signal BKSELP_TR<3:0>. Although the embodiment of FIG. 2 illustrates first to fourth row circuits, the number of row circuits may vary depending on the number of banks and the design of the semiconductor memory device.

Also, the first to fourth row circuits 210 to 240 may receive the first to fourth sense amplifier enable signals SAEN0 to SAEN3, respectively, and provide the sense amplifiers SA0 to SA2 of the corresponding banks with supply voltages RTO and SB. Herein, since the first to fourth sense amplifier enable signals SAEN0 to SAEN3 are activated after the sensing delay time SD from the input of the refresh command SBREF and the target refresh command TREF and the RAS-to-RAS delay time tRRD, the first to fourth sense amplifier enable signals SAEN0 to SAEN3 may be activated after both of the first activation signal BKSELP_NR<3:0> for activating the normal word line and the second activation signal BKSELP_TR<3:0> for activating the target word line are activated.

Also, the first to fourth row circuits 210 to 240 may generate a pass/failure signal CP_PF<3:0> which represents whether a target refresh operation is performed or not. In other words, the pass/failure signal CP_PF<3:0> may represent whether or not the normal word line and the target word line are included in the same cell mat or in adjacent cell mats, and thus whether the target word line is activated or not. For example, the pass/failure signal CP_PF<3:0> may have a logic low level when the target word line is not activated. The number of bits of the pass/failure signal CP_PF<3:0> may corresponds to the number of banks.

The target feedback circuit 140 may receive the pass/failure signal CP_PF<3:0> based on the second activation signal BKSELP_TR<3:0> and generate the feedback signal TAR_FB based on the pass/failure signal CP_PF<3:0>. When any one of the bits of the pass/failure signal CP_PF<3:0> is in a logic low level, the target feedback circuit 140 may determine that a target refresh operation is omitted, i.e., that the target refresh operation has not been performed, and generate the feedback signal TAR_FB in consideration of the omission of the target refresh operation. For example, the target feedback circuit 140 may generate the feedback signal TAR_FB of a logic high level when any one of the bits of the pass/failure signal CP_PF<3:0> is in a logic low level.

The target storage 124 may adjust the output order of the stored target address TAR_ADD based on the feedback signal TAR_FB. For example, the target storage 124 may control a previously outputted target address TAR_ADD to be outputted based on the feedback signal TAR_FB of a logic high level.

Figure 4:
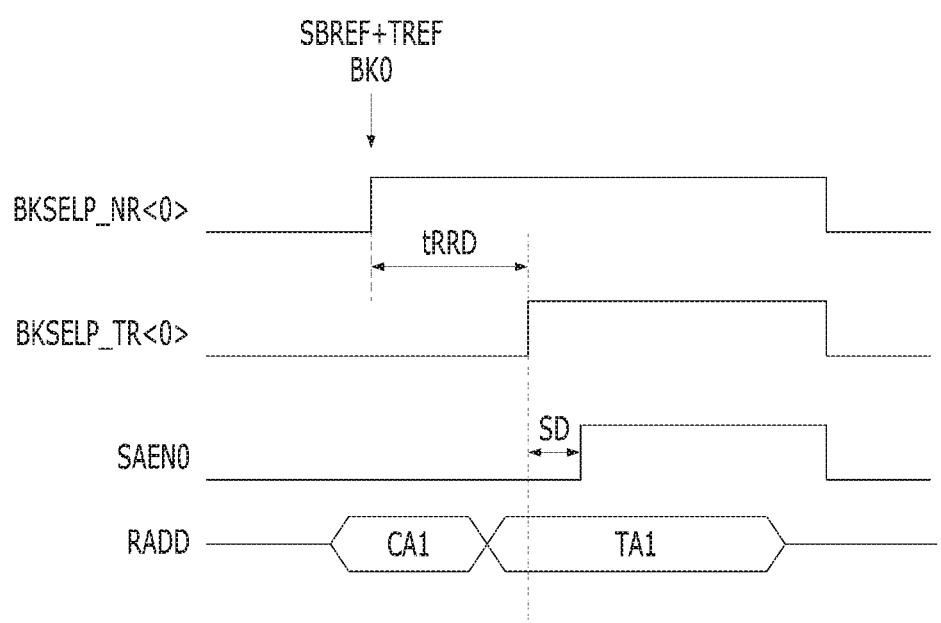
FIG. 4 is an operation waveform diagram illustrating a concept of a refresh operation in accordance with an embodiment of the present invention.

FIG. 4 is an operation waveform diagram illustrating an example of a refresh operation in accordance with an embodiment of the present invention.

Referring to FIG. 4, according to the refresh command SBREF including bank information, the address generation circuit 120 may output the counting address CA1 as the row address RADD, and the activation control circuit 110 may activate the first activation signal BKSELP_NR<0> inputted to the bank BK0. The first row circuit 210 corresponding to the first bank BK0 may activate the normal word line corresponding to the counting address CA1 based on the first activation signal BKSELP_NR<0>.

After the RAS-to-RAS delay time tRRD passes, the address generation circuit 120 may output a target address TA1 as the row address RADD according to the target refresh command TREF, and the activation control circuit 110 may activate the second activation signal BKSELP_TR<0> inputted to the first bank BK0. The first row circuit 210 may activate the target word line corresponding to the target address TA1 based on the second activation signal BKSELP_TR<0>. Herein, the first row circuit 210 may determine whether or not the normal word line corresponding to the counting address CA1 and the target word line corresponding to the target address TA1 are included in the same cell mat or in adjacent cell mats. When the normal word line and the target word line are included in the adjacent cell mats, the first row circuit 210 may control the target word line not to be activated by masking the second activation signal BKSELP_TR<0>. As a result, a target refresh operation may be omitted. The first row circuit 210 may generate a pass/failure signal CP_PF<0> representing whether a target refresh operation is performed or not, and the target feedback circuit 140 may generate a feedback signal TAR_FB based on the pass/failure signal CP_PF<0>. In this way, the output order of the target address TAR_ADD may be adjusted.

Subsequently, the sense amplifier control circuit 130 may activate the first sense amplifier enable signal SAEN0 corresponding to the first bank BK0 after the sensing delay time SD and the RAS-to-RAS delay time tRRD pass. In other words, in the embodiment of the present invention, the timing margin may be secured by refreshing the normal word line selected based on the first activation signal BKSELP_NR<0> and the target word line selected based on the second activation signal BKSELP_TR<0> all at once. In addition, since the timing margin may be secured by performing a normal refresh operation and a target refresh operation all at once, the operation may be performed without collision of row address RADD lines even if an additional active command for another bank is inputted.

Hereinafter, a detailed structure of the row circuit will be described with reference to the accompanying drawings.

Figure 5:
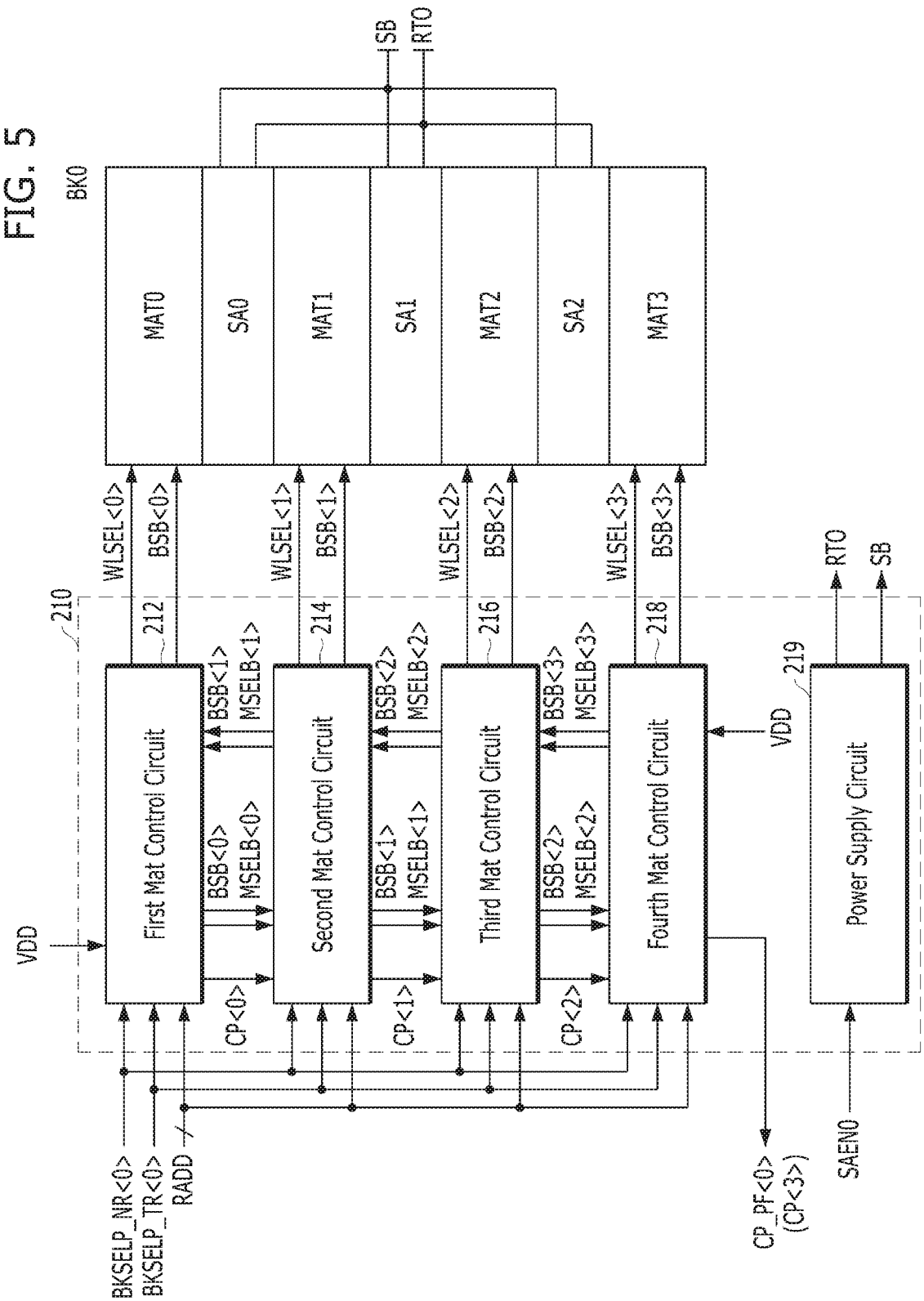
FIG. 5 is a detailed block diagram illustrating a first row circuit of FIG. 2.

FIG. 5 is a detailed block diagram illustrating the first row circuit 210 shown in FIG. 2, according to an embodiment. The second to fourth row circuits 220 to 240 may have substantially the same structure as the first row circuit 210. Thus, only the first row circuit 210 is illustrated in FIG. 5 for ease of description.

Referring to FIG. 5, the first row circuit 210 may include first to fourth mat control circuits 212 to 218 corresponding to the first to fourth cell mats MAT0 to MAT3. Although the embodiment of FIG. 5 illustrates first to fourth mat control circuits as an example, the number of the mat control circuits may vary depending on the number of cell mats and the design of the semiconductor memory device.

The first to fourth mat control circuits 212 to 218 may decode the row address RADD to generate a word line selection signal WLSEL<3:0> and a mat information signal MSELB<3:0>. The mat information signal MSELB<3:0> may be a signal for activating the first to fourth cell mats MAT0 to MAT3, and the word line selection signal WLSEL<3:0> may be a signal for selecting a word line of a corresponding cell mat. The first to fourth mat control circuits 212 to 218 may selectively output the mat information signal MSELB<3:0> as a mat selection signal BSB<3:0> based on the first activation signal BKSELP_NR<0> and the second activation signal BKSELP_TR<0>.

The first to fourth mat control circuits 212 to 218 may receive a neighboring mat section signal BSB<3:0> and a neighboring mat information signal MSELB<3:0> of at least one adjacent cell mat (i.e., an upper mat and/or a lower mat). The neighboring mat section signal BSB<3:0> may include an upper mat selection signal of the upper mat and/or a lower mat selection signal of the lower mat. The neighboring mat information signal MSELB<3:0> may include an upper mat information signal of the upper mat and/or a lower mat information signal of the lower mat. For example, the second mat control circuit 214 may receive an upper mat selection signal BSB<0>, an upper mat information signal MSELB<0>, a lower mat selection signal BSB<2>, and a lower mat information signal MSELB<2>. Herein, the first mat control circuit 212 (i.e., the uppermost mat control circuit among the mat control circuits 212 to 218) positioned in the uppermost portion may receive a signal of the power source voltage VDD level as the upper mat selection signal and the upper mat information signal, and the fourth mat control circuit 218 (i.e., the lowermost mat control circuit among the mat control circuits 212 to 218) positioned in the lowermost portion may receive the signal of the power source voltage VDD level as the lower mat selection signal and the lower mat information signal.

Each of the first to fourth mat control circuits 212 to 218 may selectively mask the second activation signal BKSELP_TR<0> based on the upper mat selection signal BSB<3:0>, the mat selection signal BSB<3:0>, and the lower mat selection signal BSB<3:0>. For example, the second mat control circuit 214 may selectively mask the second activation signal BKSELP_TR<0> based on the upper mat selection signal BSB<0>, the mat selection signal BSB<1>, and the lower mat selection signal BSB<2>. Therefore, the first to fourth mat control circuits 212 to 218 may activate the normal word line corresponding to the counting address CNT_ADD based on the first activation signal BKSELP_NR<0>, and activate the target word line corresponding to the target address TAR_ADD based on the second activation signal BKSELP_TR<0>. Herein, when the normal word line and the target word line are included in the same cell mat or in adjacent cell mats, the second activation signal BKSELP_TR<0> may be masked.

The first to fourth mat control circuits 212 to 218 may also generate the pass/failure signal CP_PF<0> which represents whether a target refresh operation is performed or not based on a comparison signal CP<0:2> (hereinafter, referred to as an 'upper comparison signal') outputted from the upper mat control circuit, a mat selection signal BSB<3:0>, the upper mat information signal MSELB<3:0>, the mat information signal MSELB<3:0>, and the lower mat information signal MSELB<3:0>. Herein, the first mat control circuit 212 may receive a signal of the power source voltage VDD level as the upper comparison signal.

For example, the first mat control circuit 212 (i.e., the uppermost mat control circuit among the mat control circuits 212 to 218) may receive the upper comparison signal (i.e., the power source voltage VDD), the upper mat selection signal (i.e., the power source voltage VDD), the upper mat information signal (i.e., the power source voltage VDD), and the lower mat information signal MSELB<1> to generate the comparison signal CP<0>. The second mat control circuit 214 may receive the upper comparison signal CP<0>, the upper mat selection signal BSB<0>, the upper mat information signal MSELB<0>, and the lower mat information signal MSELB<2> to generate the comparison signal CP<1>. The third mat control circuit 216 may receive the upper comparison signal CP<1>, the upper mat selection signal BSB<1>, the upper mat information signal MSELB<1>, and the lower mat information signal MSELB<3> to generate the comparison signal CP<1>. In the same manner, the fourth mat control circuit 218 may receive the upper comparison signal CP<2>, the upper mat selection signal BSB<2>, the upper mat information signal MSELB<2>, and the lower mat information signal (i.e., the power source voltage VDD) to generate the comparison signal CP<3>. The comparison signal CP<0:2> may include information on whether the normal word line and the target word line are included in the same cell mat or in adjacent cell mats and share a sense amplifier or not. The lowermost mat control circuit among the first to fourth mat control circuits 212 to 218 included in the first bank BK0, which is, the fourth mat control circuit 218, may output the comparison signal CP<3> as the pass/failure signal CP_PF<0> corresponding to the first bank BK0.

Meanwhile, the first row circuit 210 may further include a voltage supply circuit 219 for providing the supply voltages RTO and SB to the sense amplifiers SA0 to SA2 of the first bank BK0 based on the first sense amplifier enable signal SAEN0.

Figure 6:
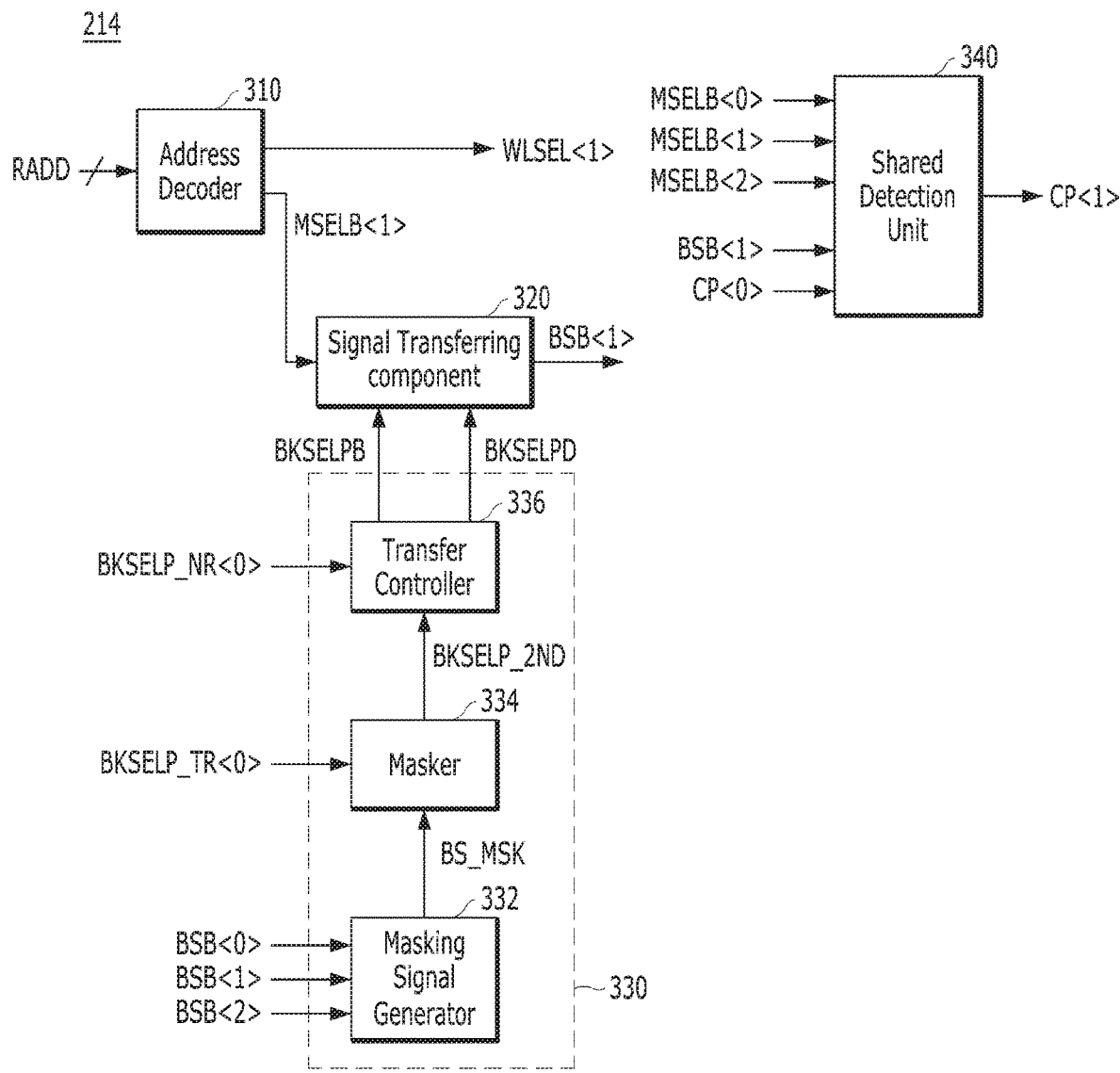
FIG. 6 is a detailed block diagram illustrating a second mat control circuit of FIG. 5.

FIG. 6 is a detailed block diagram illustrating the second mat control circuit 214 of FIG. 5. The first to fourth mat control circuits 214 to 218 may have substantially the same structure as the second mat control circuit 214. Thus, only the second mat control circuit 214 is illustrated in FIG. 6 for ease of description.

Referring to FIG. 6, the second mat control circuit 214 may include an address decoder 310, a signal transferring component 320, a masking controller 330, and a shared detection unit 340.

The address decoder 310 may generate a word line select signal WLSEL<1> and a mat information signal MSELB<1> by decoding the row address RADD. The mat information signal MSELB<1> may be a signal for activating the second cell mat MAT1, and the word line selection signal WLSEL<1> may be a signal for selecting the word line of the second cell mat MAT1. Hereinafter, the mat information signal MSELB<1> and the mat selection signal BSB<1> may be assumed to be a row active signal which is activated in a logic low level.

The signal transferring component 320 may output the mat information signal MSELB<1> as the mat selection signal BSB<1> based on the first transfer control signal BKSELPB and the second transfer control signal BKSELPD.

The masking controller 330 may generate the first transfer control signal BKSELPB and the second transfer control signal BKSELPD based on the first activation signal BKSELP_NR<0>, the second activation signal BKSELP_TR<0>, the upper mat selection signal BSB<0>, the mat selection signal BSB<1>, and the lower mat selection signal BSB<2>.

According to an embodiment, the masking controller 330 may include a masking signal generator 332, a masker 334, and a transfer controller 336.

The masking signal generator 332 may generate a masking signal BS_MSK based on the upper mat selection signal BSB<0>, the mat selection signal BSB<1>, and the lower mat selection signal BSB<2>. The masker 334 may selectively mask the second activation signal BKSELP_TR<0> according to the masking signal BS_MSK to generate the third activation signal BKSELP_2ND. The transfer controller 336 may generate the first transfer control signal BKSELPB and the second transfer control signal BKSELPD based on the first activation signal BKSELP_NR<0> and a third activation signal BKSELP_2ND.

The shared detection unit 340 may generate the comparison signal CP<1> based on the upper comparison signal CP<0>, the mat selection signal BSB<1>, the upper mat information signal MSELB<0>, the mat information signal MSELB<1>, and the lower mat information signal MSELB<2>. Herein, the mat selection signal BSB<1> may be used to detect whether the normal word line is positioned in the corresponding cell mat MAT1. The upper mat information signal MSELB<0>, the mat information signal MSELB<1>, and the lower mat information signal MSELB<2> may be used to detect whether the target word line is positioned in the upper mat MAT0, the corresponding cell mat MAT1, or the lower mat MAT2. Assuming that the normal word line is positioned in the corresponding cell mat MAT1, the shared detection unit 340 may detect that the target word line is included in the corresponding cell mat MAT1 or in any of the adjacent cell mats MAT0 and MAT2, combine the detection result with the upper comparison signal CP<0>, and output the comparison signal CP<1>.

Figure 7:
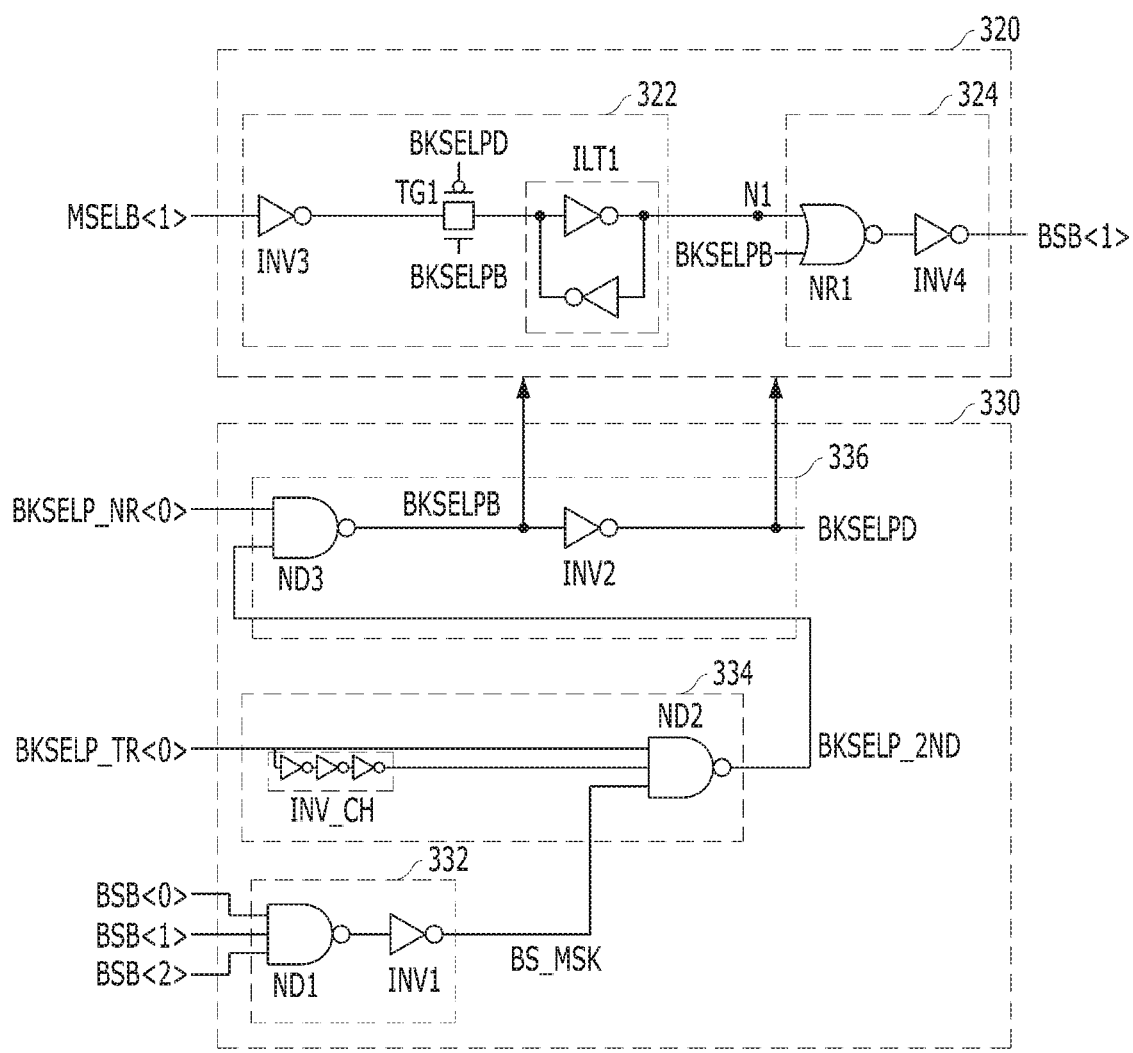
FIG. 7 is a detailed circuit diagram illustrating a masking control component and a signal transfer component of the second mat control circuit shown in FIG. 6.

FIG. 7 is a detailed circuit diagram illustrating a masking controller 330 and a signal transferring component 320 of the second mat control circuit 214 shown in FIG. 6, according to an embodiment.

Referring to FIG. 7, the masking signal generator 332 may include a first NAND gate ND1 and a first inverter INV1. The masking signal generator 332 may generate a masking signal BS_MSK by performing a logic AND operation onto the upper mat selection signal BSB<0>, the mat selection signal BSB<1>, and the lower mat selection signal BSB<2>. In other words, the masking signal generator 332 may generate a masking signal BS_MSK that is activated to a logic low level, when at least one among the upper mat selection signal BSB<0>, the mat selection signal BSB<1>, and the lower mat selection signal BSB<2> is activated to a logic low level.

The masker 334 may include an inverter chain INV_CH in which an odd number of inverters are coupled in series and a second NAND gate ND2. The inverter chain INV_CH may receive the second activation signal BKSELP_TR<0> and invert and delay it. The second NAND gate ND2 may generate the third activation signal BKSELP_2ND by performing a logic NAND operation onto the output of the inverter chain INV_CH, the second activation signal BKSELP_TR<0>, and the masking signal BS_MSK. In other words, when the masking signal BS_MSK is deactivated to a logic high level, the masker 334 may operate as a pulse generator and generate the third activation signal BKSELP_2ND that pulses to a logic low level during an initial period of an activation period of the second activation signal BKSELP_TR<0>. On the other hand, when the masking signal BS_MSK is activated to a logic low level, the masker 334 may mask the second activation signal BKSELP_TR<0> and fix the third activation signal BKSELP_2ND to a logic high level and output the third activation signal BKSELP_2ND of the logic high level.

The transfer controller 336 may include a third NAND gate ND3 and a second inverter INV2. The transfer controller 336 may generate the first transfer control signal BKSELPB by performing a logic NAND operation onto the first activation signal BKSELP_NR<0> and the third activation signal BKSELP_2ND, and generate the second transfer control signal BKSELPD by inverting the first transfer control signal BKSELPB. In other words, when at least one among the first activation signal BKSELP_NR<0> and the third activation signal BKSELP_2ND is deactivated, the transfer controller 336 may output the first transfer control signal BKSELPB of a logic high level and the second transfer control signal BKSELPD of a logic low level, and when both of the first activation signal BKSELP_NR<0> and the third activation signal BKSELP_2ND are activated, the transfer controller 336 may output the first transfer control signal BKSELPB of a logic low level and the second transfer control signal BKSELPD of a logic high level.

According to an embodiment, the signal transferring component 320 may include an information storage 322 and an outputter 324.

The information storage 322 may include a third inverter INV3, a transfer gate TG1, and an inverter latch ILT1. The third inverter INV3 may invert the mat information signal MSELB<1>. The transfer gate TG1 may transfer the output of the third inverter INV3 based on the first transfer control signal BKSELPB and the second transfer control signal BKSELPD. The inverter latch ILT1 may invert and latch the signal transferred from the transfer gate TG1 and store it in a first node N1. In other words, the information storage 322 may transfer and latch the mat information signal MSELB<1> based on the first transfer control signal BKSELPB of a logic high level and the second transfer control signal BKSELPD of a logic low level to and in the first node N1.

The outputter 324 may include a NOR gate NR1 and a fourth inverter INV4. The NOR gate NR1 and the fourth inverter INV4 may output the mat selection signal BSB<i> by performing a logic OR operation onto the first transfer control signal BKSELPB and the output of the inverter latch ILT1. In other words, the outputter 324 may output the signal of the first node N1 as the mat selection signal BSB<1> based on the first transfer control signal BKSELPB of a logic low level.

In the above-described embodiment, when the first transfer control signal BKSELPB is in a logic high level and the second transfer control signal BKSELPD is in a logic low level, the signal transferring component 320 may transfer the mat information signal MSELB<1> to the first node N1 and latch it therein. Herein, the signal transferring component 320 may output the mat selection signal BSB<1> deactivated to a logic high level. On the other hand, when the first transfer control signal BKSELPB is in a logic low level and the second transfer control signal BKSELPD is in a logic high level, the signal transferring component 320 may output the mat information signal MSELB<1> latched in the first node N1 as the mat selection signal BSB<1>.

Hereinafter, an operation of the second mat control circuit 214 will be described with references to FIGS. 5 to 7.

Figure 8:
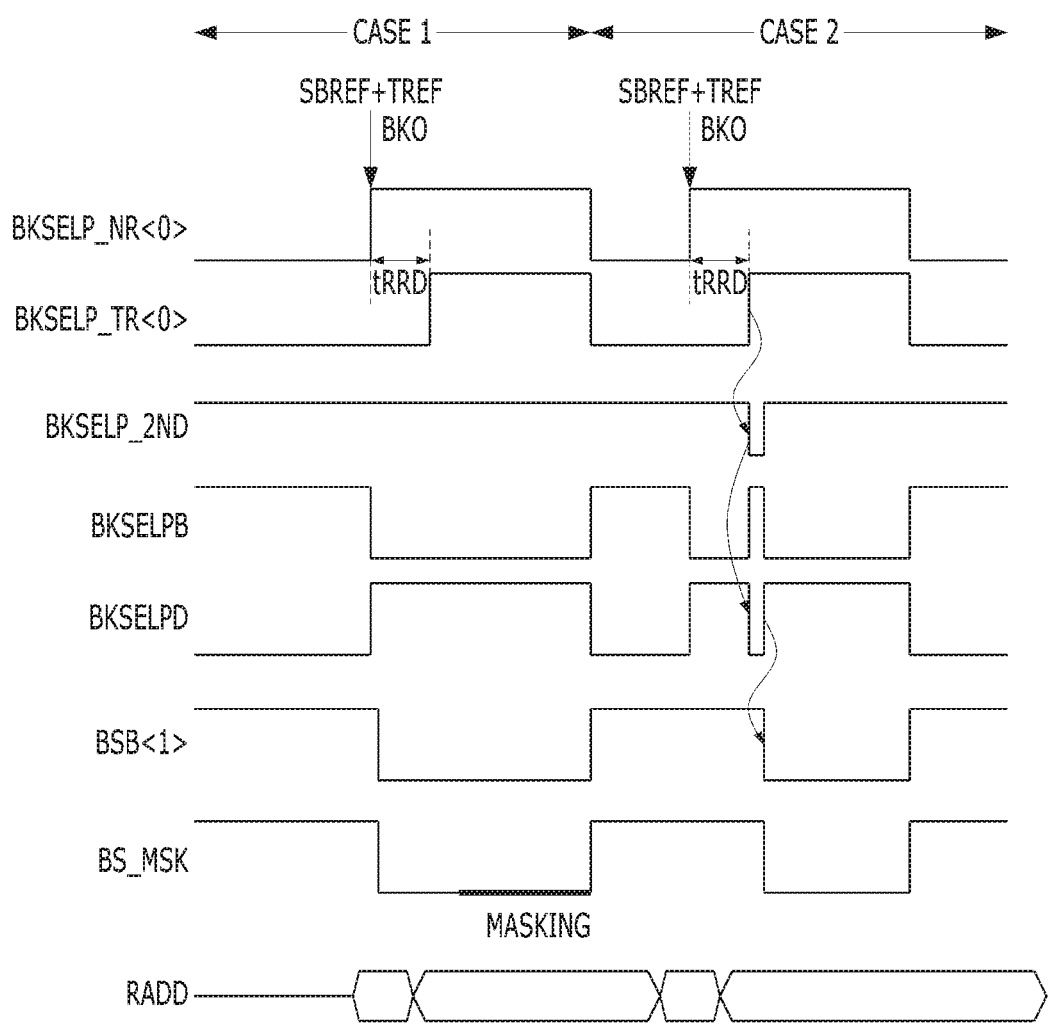
FIGS. 8 and 9 are waveform diagrams describing an operation of the second mat control circuit shown in FIG. 6.
Figure 9:
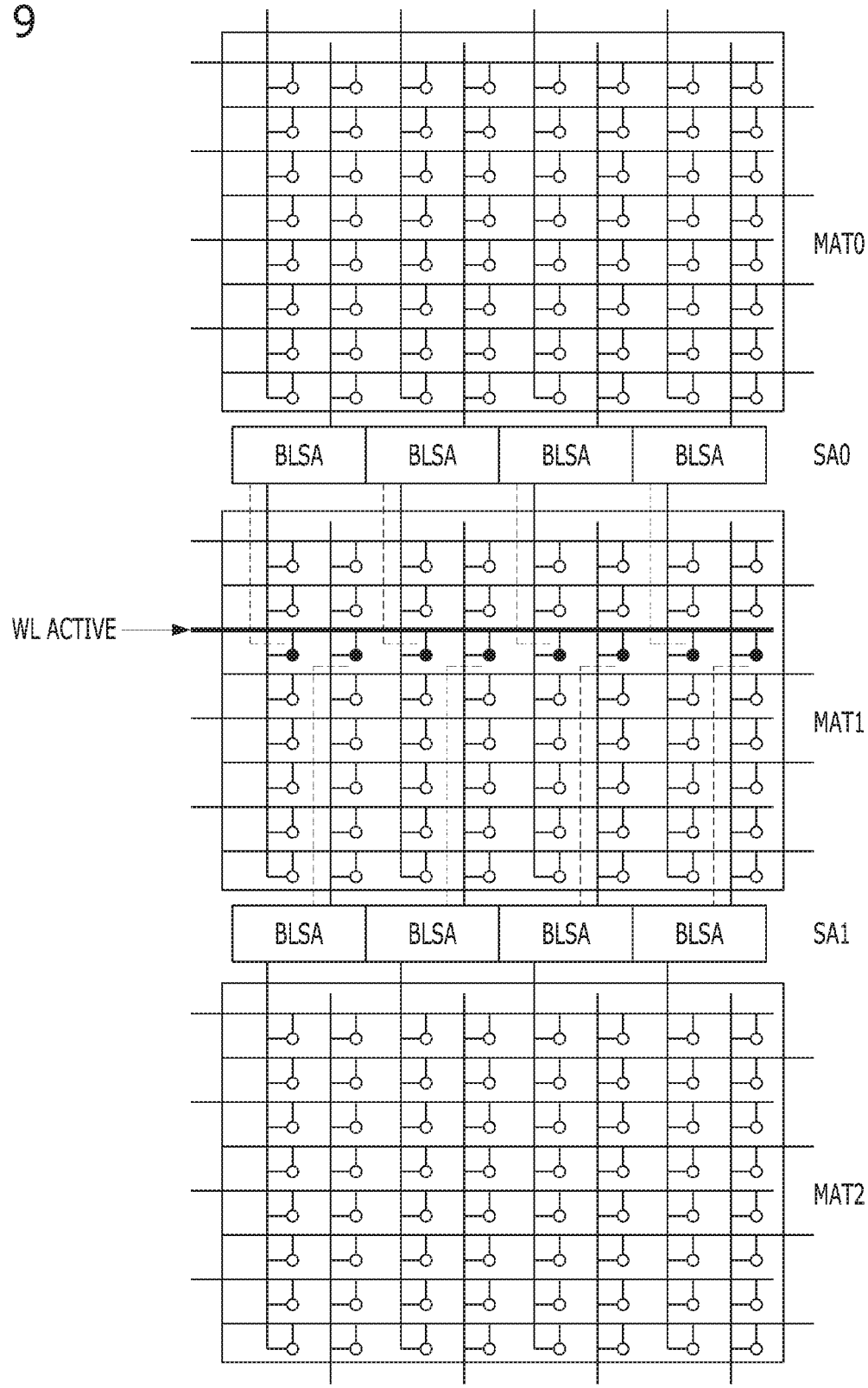

FIGS. 8 and 9 are waveform diagrams describing the operation of the second mat control circuit 214 shown in FIG. 6.

Referring to FIG. 8, CASE 1 is a case where a row address RADD corresponding to a normal word line of a second cell mat MAT1 in the first bank BK0 is inputted during a normal refresh operation.

The address decoder 310 may decode the row address RADD to generate a word line selection signal WLSEL<1> and a mat information signal MSELB<1>. The signal transferring component 320 may latch the mat information signal MSELB<1> in the first node N1 based on the second transfer control signal BKSELPD of a logic low level. Herein, the signal transferring component 320 may output the mat selection signal BSB<1> which is deactivated to a logic high level based on the first transfer control signal BKSELPB of a logic high level.

When the first activation signal BKSELP_NR<0> corresponding to the first bank BK0 is activated to a logic high level, the masking controller 330 may output the first transfer control signal BKSELPB of a logic low level and the second transfer control signal BKSELPD of a logic high level based on the third activation signal BKSELP_2ND of a logic high level. The signal transferring component 320 may output the mat information signal MSELB<1> latched in the first node N1 as the mat selection signal BSB<1>. In other words, the mat selection signal BSB<1> may be activated to a logic low level. The masking signal generator 332 may generate a masking signal BS_MSK which is activated to a logic low level because the mat selection signal BSB<1> is activated to a logic low level. The masker 334 may fix the third activation signal BKSELP_2ND to a logic high level by masking the second activation signal BKSELP_TR<0> based on the masking signal BS_MSK and output it.

Subsequently, even though the second activation signal BKSELP_TR<0> corresponding to the first bank BK0 is inputted at the interval of the RAS-to-RAS delay time tRRD, since the masking signal BS_MSK is activated, no further toggling of the first transfer control signal BKSELPB and the second transfer control signal BKSELPD may occur. Therefore, since the target word line of the second cell mat MAT1 is not activated, the target refresh operation may not be performed.

Referring to FIG. 9, when a normal word line is present in the second cell mat MAT1, the masking signal BS_MSK in the first mat control circuit 212 and the third mat control circuit 216 may also be activated as well. Therefore, the target refresh operation may be omitted in the first cell mat MAT0 and the third cell mat MAT2 sharing the sense amplifiers SA0 and SA1. On the other hand, since the masking signal BS_MSK in the fourth mat control circuit 218 is deactivated to a logic high level, a target refresh operation may be performed when the target word line is present in the fourth cell mat MAT3.

Referring back to FIG. 8, CASE 2 is a case where the row address RADD corresponding to the normal word line of the fourth cell mat MAT3 in the first bank BK0 is inputted during a normal refresh operation and the row address RADD corresponding to the target word line of the second cell mat MAT1 in one bank BK0 is inputted during a target refresh operation.

The address decoder 310 may generate the word line select signal WLSEL<1> and the mat information signal MSELB<1> by decoding the row address RADD. Herein, since the row address RADD corresponds to the normal word line of the fourth cell mat MAT3, the mat information signal MSELB<1> may maintain the deactivated state of a logic high level. In other words, even though the first activation signal BKSELP_NR<0> corresponding to the first bank BK0 is activated to a logic high level, the signal transferring component 320 may maintain the mat selection signal BSB<1> in a logic high level. Accordingly, the masking signal generator 332 may maintain the masking signal BS_MSK in a logic high level.

Subsequently, when the row address RADD corresponding to the target word line of the second cell mat MAT1 is inputted in the interval of the RAS-to-RAS delay time tRRD, the address decoder 310 may generate the word line selection signal WLSEL<1> and the mat information signal MSELB<1> by decoding the row address RADD. When the second activation signal BKSELP_TR<0> corresponding to the first bank BK0 is inputted, the masker 334 may operate as a pulse generator to generate the third activation signal BKSELP_2ND that pulses in a logic low level during the initial section of the activation period of the second activation signal BKSELP_TR<0>. The signal transferring component 320 may latch the mat information signal MSELB<1> in the first node N1 based on the second transfer control signal BKSELPD that pulses for a predetermined section in a logic low level, and as the second transfer control signal BKSELPD transitions to a logic high level, the mat information signal MSELB<1> latched in the first node N1 may be outputted as the mat selection signal BSB<1>. In other words, the mat selection signal BSB<1> may be activated to a logic low level. Accordingly, a target refresh operation may be performed on the second cell mat MAT1.

Meanwhile, when the normal word line is present in the fourth cell mat MAT3, the masking signal BS_MSK in the third mat control circuit 216 may also be activated. Therefore, a target refresh operation may be omitted in the third cell mat MAT2 sharing the sense amplifiers SA2. Meanwhile, when the target word line is present in the first cell mat MAT0 and the second cell mat MAT1 that do not share the sense amplifiers SA2, the target refresh operation may be performed.

Figure 10:
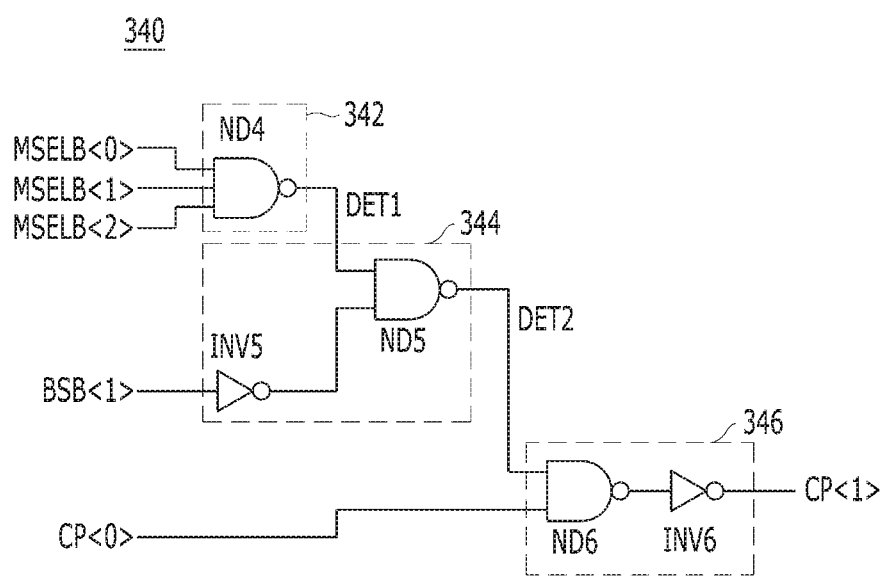
FIG. 10 is a detailed circuit diagram illustrating a shared detection unit of the second mat control circuit shown in FIG. 6.

FIG. 10 is a detailed circuit diagram illustrating the shared detection unit 340 of the second mat control circuit 214 shown in FIG. 6, according to an embodiment.

Referring to FIG. 10, the shared detection unit 340 may include a first detector 342, a second detector 344, and a comparison combiner 346.

The first detector 342 may generate the first determination signal DET1 based on the upper mat information signal MSELB<0>, the mat information signal MSELB<1>, and the lower mat information signal MSELB<2>. The first determination signal DET1 may detect where the target word line is positioned among the upper mat MAT0, the corresponding cell mat MAT1, or the lower mat MAT2. The first detector 342 may be realized as a fourth NAND gate ND4 and, when at least one among the upper mat information signal MSELB<0>, the mat information signal MSELB<1>, and the lower mat information signal MSELB<2> is activated to a logic low level, the first detector 342 output the first determination signal DET1 of a logic high level.

The second detector 344 may generate the second determination signal DET2 based on the first determination signal DET1 and the mat selection signal BSB<1>. The second determination signal DET2 may detect whether the normal word line and the target word line are included in the same cell mat or in adjacent cell mats. The second detector 344 may include a fifth inverter INV5 for inverting the mat selection signal BSB<1> and a fifth NAND gate ND5 for performing a logic NAND operation on the output of the and the fifth inverter INV5 and the first determination signal DET1. The second detector 344 may output the second determination signal DET2 of a logic high level when the mat selection signal BSB<1> is activated to a logic low level and the first determination signal DET1 is in a logic high level. Therefore, assuming that the normal word line is positioned in the corresponding cell mat MAT1, when it is detected that the target word line is included in the corresponding cell mat MAT1 or in any of the adjacent cell mats MAT0 and MAT2, the second determination signal DET2 of a logic high level may be outputted.

The comparison combiner 346 may output the comparison signal CP<1> by combining the second determination signal DET2 and the upper comparison signal CP<0>. The comparison combiner 346 may include a sixth NAND gate ND6 and a sixth inverter INV6, and perform a logic AND operation on the second determination signal DET2 and the upper comparison signal CP<0>. When the second determination signal DET2 and the upper comparison signal CP<0> are both in a logic high level, the comparison combiner 346 may output the comparison signal CP<1> of a logic high level, and when at least one between the second determination signal DET2 and the upper comparison signal CP<0> is in a logic low level, the comparison combiner 346 may output the comparison signal CP<1> of a logic low level.

According to the above-described embodiment, assuming that the normal word line is positioned in the corresponding cell mat MAT1, the shared detection unit 340 may detect that the target word line is included in the corresponding cell mat MAT1 or any of the adjacent cell mats MAT0 and MAT2, to generate the comparison signal CP<1> of a logic low level. Otherwise, the shared detection unit 340 may output the upper comparison signal CP<0> as the comparison signal CP<1>. Herein, when at least one among the shared detection units 340 that are included in the first to fourth mat control circuits 212 to 218 of FIG. 5 generates the comparison signal CP<0:3> of a logic low level, the fourth mat control circuit 218 may finally output the comparison signal CP<3> of a logic low level as the pass/failure signal CP_PF<0>.

The target feedback circuit 140 of FIG. 2 may receive the pass/failure signal CP_PF<0> based on the second activation signal BKSELP_TR<0>, determine that the execution of a target refresh operation is omitted, and generate a feedback signal TAR_FB. The target storage 124 may adjust the output order of the stored target address TAR_ADD based on the feedback signal TAR_FB.

As described above, according to various embodiments of the present invention, a normal word line of a particular cell mat of a bank which is selected according to a refresh command SBREF including bank information may be activated, and a target word line of a cell mat which does not share a sense amplifier with the particular cell mat may be activated after a predetermined delay time passes according to a target refresh command TREF. Subsequently, the sense amplifier may be enabled to perform a normal refresh operation and a target refresh operation all at once, thereby securing the timing margin. Also, even though an additional active command for another bank is inputted, it may be possible to perform an operation without collision with a row address RADD line, thereby improving the refresh efficiency.

According to the embodiments of the present invention, the efficiency of a refresh operation may be improved, as the semiconductor memory device may be able to selectively perform a target refresh operation during a single-bank refresh operation.

While the present invention has been described with respect to the various embodiments, it will be apparent to those skilled in the art that various changes and modifications may be made without departing from the spirit and scope of the invention as defined in the following claims. For example, the logic gates and transistors illustrated in the above embodiments should be realized in different positions and types according to the polarity of an input signal.

What is claimed is:

1. A semiconductor memory device, comprising:
   a plurality of banks each including a plurality of cell mats and a plurality of sense amplifiers shared by adjacent cell mats; and
   a bank control circuit suitable for activating a normal word line of a particular cell mat of a bank selected according to a refresh command including bank information, and activating a target word line of a cell mat that does not share a sense amplifier with the particular cell mat according to a target refresh command after a preset delay time,
   wherein the bank control circuit activates sense amplifier enable signals for enabling the sense amplifiers after activating the normal word line and the target word line.

2. The semiconductor memory device of claim 1, wherein the preset delay time is a RAS-to-RAS delay time (tRRD).

3. The semiconductor memory device of claim 1, wherein the bank control circuit includes:
   an activation control circuit suitable for outputting a first activation signal and a second activation signal to the selected bank at an interval of the preset delay time according to the refresh command and the target refresh command, respectively;
   an address generation circuit suitable for selecting a counting address according to the refresh command, and selecting and outputting a pre-stored target address according to the target refresh command; and
   a plurality of row circuits respectively corresponding to the banks, suitable for activating the normal word line corresponding to the counting address based on the first activation signal, and activating the target word line corresponding to the target address based on the second activation signal while masking the second activation signal when the normal word line and the target word line are included in the same cell mat or in the adjacent cell mats.

4. The semiconductor memory device of claim 3, wherein the bank control circuit further includes:
   a sense amplifier control circuit suitable for generating the sense amplifier enable signals for enabling the sense amplifiers and activating the sense amplifier enable signals according to the refresh command and the target refresh command after the preset delay time passes.

5. The semiconductor memory device of claim 3, wherein each of the row circuits generates a pass/failure signal representing whether the normal word line and the target word line are included in the same cell mat or in the adjacent cell mats, and the bank control circuit further includes:
a target feedback circuit suitable for receiving the pass/failure signal based on the second activation signal, and generating a feedback signal based on the pass/failure signal.

6. The semiconductor memory device of claim 5, wherein the address generation circuit includes:
an address counter suitable for counting the refresh command for generating the counting address;
a target storage suitable for selecting and outputting the target address from pre-stored addresses therein according to the target refresh command, and controlling the outputting of the target address based on the feedback signal; and
an address selector suitable for outputting the counting address and the target address at the interval of the preset delay time.

7. A semiconductor memory device, comprising:
a plurality of banks each including a plurality of cell mats and a plurality of sense amplifiers shared by adjacent cell mats;
an activation control circuit suitable for generating a first activation signal according to a refresh command including bank information, generating a second activation signal according to a target refresh command, and outputting the first activation signal and the second activation signal to a selected bank among the plurality of banks at an interval of a preset delay time; and
a plurality of mat control circuits respectively corresponding to the cell mats of each bank, suitable for activating a normal word line based on the first activation signal, and activating the target word line based on the second activation signal while masking the second activation signal when the normal word line and the target word line are included in the same cell mat or in the adjacent cell mats.

8. The semiconductor memory device of claim 7, further comprising:
a sense amplifier control circuit suitable for generating sense amplifier enable signals for enabling the sense amplifiers and activating the sense amplifier enable signals according to the refresh command and the target refresh command after the preset delay time passes.

9. The semiconductor memory device of claim 7, wherein each of the mat control circuits includes:
an address decoder suitable for decoding a row address to generate a word line selection signal and a mat information signal;
a signal transferring component suitable for outputting the mat information signal as a mat selection signal based on a transfer control signal; and
a masking controller suitable for generating the transfer control signal based on the first activation signal, the second activation signal, the mat selection signal, and a neighboring mat selection signal of at least one adjacent cell mat.

10. The semiconductor memory device of claim 9, wherein the masking controller includes:
a masking signal generator suitable for generating a masking signal based on the mat selection signal and the neighboring mat selection signal;
a masker suitable for selectively masking the second activation signal based on the masking signal to generate a third activation signal; and
a transfer controller suitable for generating the transfer control signal based on the first activation signal and the third activation signal.

11. The semiconductor memory device of claim 9, wherein the signal transferring component includes:
an information storage suitable for latching the mat information signal in a first node based on a first logic level of the transfer control signal; and
an outputter suitable for outputting a signal of the first node as the mat selection signal based on a second logic level of the transfer control signal.

12. The semiconductor memory device of claim 9, wherein each of the mat control circuits further includes:
a shared detection unit suitable for generating a comparison signal for detecting a case where the normal word line and the target word line are included in the same cell mat or in the adjacent cell mats based on the mat information signal, a neighboring mat information signal of at least one adjacent cell mat, the mat selection signal, and an upper comparison signal of an upper mat control circuit.

13. The semiconductor memory device of claim 12, wherein the shared detection unit includes:
a first detector suitable for generating a first determination signal for detecting a cell mat in which the target word line is positioned based on the mat information signal and the neighboring mat information signal;
a second detector suitable for generating a second determination signal for detecting whether the normal word line and the target word line are included in the same cell mat or in the adjacent cell mats based on the first determination signal and the mat selection signal; and
a comparison combiner suitable for generating the comparison signal by combining the second determination signal and the upper comparison signal.

14. The semiconductor memory device of claim 12, further comprising:
a target feedback circuit suitable for generating a feedback signal by receiving a comparison signal outputted from a lowermost mat control circuit among the mat control circuits included in each bank as a pass/failure signal and, based on the second activation signal.

15. The semiconductor memory device of claim 14, further comprising:
an address generation circuit suitable for selecting a counting address according to the refresh command, outputting the counting address as the row address according to the target refresh command, and controlling the outputting of the target address based on the feedback signal.

16. A method for operating a semiconductor memory device, comprising:
providing a plurality of banks each including a plurality of cell mats and a plurality of sense amplifiers shared by adjacent cell mats;
outputting a first activation signal and a counting address to a bank selected according to a refresh command including bank information;
activating a normal word line corresponding to the counting address based on the first activation signal;
outputting a second activation signal and a pre-stored target address to the selected bank at an interval of a preset delay time; and
activating a target word line corresponding to the target address based on the second activation signal while deactivating the target word line by masking the second activation signal when the normal word line and the target word line are included in the same cell mat or in the adjacent cell mats.

17. The method of claim 16, wherein the preset delay time is a RAS-to-RAS delay time (tRRD).

18. The method of claim 16, further comprising:
activating sense amplifier enable signals for enabling the sense amplifiers according to the refresh command after the preset delay time passes.

19. The method of claim 16, further comprising:
generating a pass/failure signal representing whether the target word line is deactivated; and
generating a feedback signal for controlling the outputting of the pre-stored target address based on the pass/failure signal.

20. The method of claim 16, wherein the first activation signal is a signal for a single bank refresh operation, and the second activation signal is a signal for a target refresh operation.

21. A memory device comprising:
a storage circuit including groups of memory cells electrically coupled to word lines and sense amplifiers each electrically coupled to neighboring ones among the groups; and
a control circuit configured to activate first and second word lines among the word lines at a preset interval of time respectively in response to first and second refresh commands,
wherein the first and second word lines are electrically coupled to different ones among the groups electrically coupled to different ones among the sense amplifiers, and the control circuit activates sense amplifier enable signals for enabling the sense amplifiers after activating the first and second word lines.

22. A memory device comprising:
a bank including cell mats electrically coupled to word lines and sense amplifiers each electrically coupled to neighboring ones among the cell mats;
a first control circuit configured to provide a first pair of a first active signal and a first address and a second pair of a second active signal and a second address at a preset interval of time respectively in response to first and second refresh commands; and
a second control circuit configured to activate a word line corresponding to the first pair among the word lines when the first and second addresses correspond to word lines, among the word lines, electrically coupled to a single one or neighboring ones among the cell mats and activate word lines respectively corresponding to the first and second pairs among the word lines otherwise.

* * * * *